US005700322A

United States Patent [19]
Fort

[11] Patent Number: 5,700,322
[45] Date of Patent: Dec. 23, 1997

[54] CONTINUOUS HOT MELT ADHESIVE APPLICATOR

[75] Inventor: Wesley C. Fort, Norcross, Ga.

[73] Assignee: Nordson Corporation, Westlake, Ohio

[21] Appl. No.: 322,034

[22] Filed: Oct. 12, 1994

Related U.S. Application Data

[63] Continuation of Ser. No. 128,872, Sep. 29, 1993, abandoned.

[51] Int. Cl.$^6$ .......... C23C 14/00

[52] U.S. Cl. .......... 118/50; 118/313; 427/207.1; 427/421

[58] Field of Search .......... 118/50, 50.1, 62, 118/63, 302, 316, DIG. 2, 313; 427/286, 207.1, 421, 422, 424; 239/551, 556, 557, 562, 584, 585.5, 298, 418

[56] References Cited

U.S. PATENT DOCUMENTS

| | | | |
|---|---|---|---|
| Re. 27,865 | 1/1974 | Baker et al. . | |
| 3,126,574 | 3/1964 | Fox . | |
| 4,488,665 | 12/1984 | Cocks et al. | 222/146.5 |
| 4,598,841 | 7/1986 | Smiles . | |
| 4,785,996 | 11/1988 | Ziecker et al. | 239/298 |
| 4,815,660 | 3/1989 | Boger | 239/8 |
| 4,969,602 | 11/1990 | Scholl . | |
| 4,983,109 | 1/1991 | Miller et al. | 425/7 |
| 4,989,792 | 2/1991 | Claassen | 239/586 |
| 5,065,943 | 11/1991 | Boger et al. . | |

*Primary Examiner*—Jeffrey Snay
*Attorney, Agent, or Firm*—Wood, Herron & Evans, L.L.P.

[57] ABSTRACT

A hot melt applicator particularly adapted to apply a continuous coating of hot melt adhesive to a substrate includes a plurality of dispensing nozzles connected directly to an adhesive manifold having passages for directing molten hot melt adhesive to each of the dispensing nozzles. A plurality of needle valves corresponding in number to the dispensing nozzles are also connected to the adhesive manifold for allowing individual control of the adhesive flowing to each nozzle. The applicator further includes an air manifold for supplying pressurized air to each of the dispensing nozzles and for causing the adhesive to be discharged from some or all of the nozzles in a swirling pattern. At least one adhesive supply valve is mounted to the adhesive manifold for controlling the supply of adhesive to the passages in the adhesive manifold and ultimately to the nozzles. A cleaning fluid control valve is also mounted to the adhesive manifold for controlling the supply of cleaning fluid through the passages in the adhesive manifold and the nozzles.

12 Claims, 2 Drawing Sheets

CONTINUOUS HOT MELT ADHESIVE APPLICATOR

This application is a file wrapper continuation of application Ser. No. 08/128,872, filed Sep. 29, 1993 , now abandoned.

BACKGROUND OF THE INVENTION

This invention generally relates to adhesive dispensing devices and more particularly to a continuous laminating adhesive application system.

Hot melt thermal plastic adhesives have been widely used in industry for adhering many types of products and are particularly useful in applications which necessitate quick setting times. Such applications include the lamination of an outer protective sheet on an inner insulating foam core during the manufacture of doors, door panels and the like. Other applications include, for example, the lamination of two layers of paper during the manufacture of paper products and the lamination of vapor barriers to fiberglass panels for use in constructing recreational vehicles.

One apparatus commonly employed in the manufacture of such laminated products is a metering gearhead having a plurality of spaced discharge orifices, each supplied with adhesive from a gear pump. These discharge orifices are positioned relative to one substrate to apply parallel beads of adhesive thereto for subsequent attachment to a second substrate. There are two primary desirable features associated with metering gearheads. First, they allow precise control of the quantity of adhesive dispensed from the discharge orifices. Second, the adhesive beads may be precisely located on a substrate to produce multiple beads of adhesive are produced having uniform size, width and spacing. One spray system utilizing a metering gearhead is shown in U.S. Pat. No. 4,983,109 to Miller et al.

Other past adhesive spray systems have included two or more adhesive dispensing guns mounted side by side to a manifold having an adhesive supply passageway connected to a source of hot melt adhesive and an air supply passageway connected to a source of pressurized air. In these systems each of the dispensing guns includes a relatively complex valve for providing on/off and flow control of the adhesive through a nozzle having an adhesive discharge passageway communicating with the adhesive supply passageway of the manifold. The nozzle is provided with a plurality of air jets each communicating with the air supply passageway of the manifold. A bead of hot melt adhesive is ejected from each nozzle which is impacted at its outer periphery by jets of air from the air discharge orifices of the nozzle to attenuate the adhesive bead forming elongated adhesive fibers, and to impart a rotation or twisting motion to the elongated fibers forming a spiral spray pattern. One example of this type of dispensing system is found in U.S. Pat. No. 4,815,660 to Boger.

Although systems such as those disclosed by Miller et al. and Boger are quite necessary for certain applications, in applications not requiring such precise dispensing control, the use of such systems unnecessarily increases the costs associated with the adhesive application operation. In this regard, metering gearheads comprised of multiple gear pumps such as those used in the Miller et al, system, are high cost items and also costly to maintain. In regard to systems such as the one disclosed by Boger, the numerous relatively complex and expensive dispensing guns or modules necessary to apply a wide path of adhesive to a substrate make these systems costly alternatives for applications which do not require quick on/off and flow control of adhesive. Applications involving continuous lamination of wide substrates, such as lamination of panels used in the manufacture of recreational vehicles and mobile home structures as well as insulated doors and door panels, do not require such precise on/off control and "on the fly " flow control of each dispensing nozzle during the lamination process.

Moreover, with the ever increasing demands to replace solvent and, in some cases, water based adhesives, hot melts are becoming accepted as viable alternatives. Polyurethane resin (PUR) hot melt adhesives in addition to more traditional pressure sensitive hot melts are being increasingly used for laminating applications. The specific types of continuous lamination applications range from the bonding of vapor barriers to fiberglass panels during the manufacture of RV's to the laminating of insulated doors and door panels as mentioned above. When utilizing PUR hot melts in adhesive dispensing systems, clean-up and maintenance of the dispensing systems become important considerations. this regard, PUR hot melts are not generally easily cleaned or flushed from dispensing systems having a large number of small precision parts. Thus, such systems are especially difficult to clean and maintain if used with PUR hot melts and are therefore more likely to require increased downtime and maintenance.

Accordingly, there is a need in the art for a system which cost effectively applies hot melt adhesive in a continuous manner and which is especially useful for applying PUR hot melts to substrates in continuous lamination applications.

It is therefore among the objectives of this invention to provide a cost effective manner of applying hot melt adhesive across wide substrates during continuous laminating operations.

It is another object of the invention to provide a hot melt applicator with which many types of hot melt adhesives may be used but which is very well suited for the specific needs of PUR hot melts.

It has been a further object of the invention to provide structure for applying either an equal amount of adhesive across the width of a substrate in a continuous operation or to alternatively apply a profiled or varying amount of adhesive across the width of the substrate in a continuous laminating operation.

It has been still a further object of the invention to eliminate maintenance and cleaning problems associated with past adhesive application systems.

It has been yet another object of the invention to provide a low cost alternative adhesive applicator for those applications requiring less precise adhesive flow control.

It has been still another object of the invention to provide individual nozzles which are easily retrofitted to nozzles having different types or patterns of output depending on the adhesive dispensing requirements of different applications.

SUMMARY OF THE INVENTION

These and other objectives are accomplished by the present invention which comprises a series of modular dispensing nozzles individually and removably attached directly to an adhesive manifold for applying adhesive on a substrate. The applicator further includes an air manifold for supplying pressurized air to each of the dispensing nozzles. At least one control valve is mounted to the adhesive manifold for controlling the flow of adhesive to the adhesive manifold. Individual needle valves are provided in the adhesive manifold in one to one correspondence with the dispensing nozzles attached to the adhesive manifold. The needle valves allow individual or separate adjustment of the amount of adhesive flowing to each dispensing nozzle from a longitudinally extending adhesive passageway in the adhesive manifold. Thus, the flow of adhesive from each dispensing nozzle is easily adjusted by rotation of the needle valve to balance or equalize the amount of adhesive dispensed along the length of the applicator or to alternatively produce heavier application of adhesive from a segment or segments of the applicator and lighter application of adhesive from other segments of the applicator.

In the preferred embodiment of the invention, the applicator is part of a system for applying PUR hot melts in continuous lamination applications. The PUR application system includes means for easily flushing PUR from the applicator. In this regard, a separate control valve, which may be the same type of valve used to control the flow of adhesive to the adhesive manifold, is mounted to the adhesive manifold and operatively connected to a PUR flush system which directs cleaning fluid through the control valve and into the passageways in the adhesive manifold and ultimately through the dispensing nozzles. Other elements of the PUR laminating system include conventional components such as a PUR bulk melter, an air supply system and a system of heated hoses for directing the adhesive and air to the respective adhesive and air manifolds of the applicator. A temperature controller is also provided to heat the adhesive hoses and air hoses to the proper system temperature which maintains the adhesive in a molten state. A conventional resistance temperature detector (RTD) is provided within the adhesive manifold for maintaining precise temperature control of the molten hot melt adhesive by way of a separate heating element contained within and extending along the adhesive manifold.

One advantage of the present invention is that the applicator requires very little maintenance since it has few moving parts and is relatively simple in design. The applicator is more cost effective to use in continuous lamination operations and more easily maintained as compared to the metering gearhead and dispensing gun systems mentioned above. As the applicator of the present invention includes very few moving parts, it is especially suitable for use with PUR hot melts and further incorporates a separate flush system for cleaning the applicator of PUR.

Other advantages and desirable features of the present invention include the ability to easily retrofit dispensing nozzles by simply removing individual nozzle bodies from the adhesive manifold and replacing them with other nozzle bodies. In this regard, each nozzle body is individually attached to the adhesive manifold by screws to allow for easy changeover and repair or replacement of nozzle bodies.

Finally, individual needle valve control of the adhesive flowing to each dispensing nozzle from the adhesive manifold provides a simple, cost efficient manner of equalizing the amount of adhesive being dispensed from each nozzle for uniform coverage. Alternatively, the needle valves in the adhesive manifold allow the amount of dispensed adhesive to be varied across the length of the applicator to apply both heavy and light coating portions in a given application.

Additional advantages and objectives of the present invention will become more readily apparent from the following detailed description taken in conjunction with the accompanying drawings.

DETAILED DESCRIPTION OF THE PREFERRED EMBODIMENT

Figure 1:
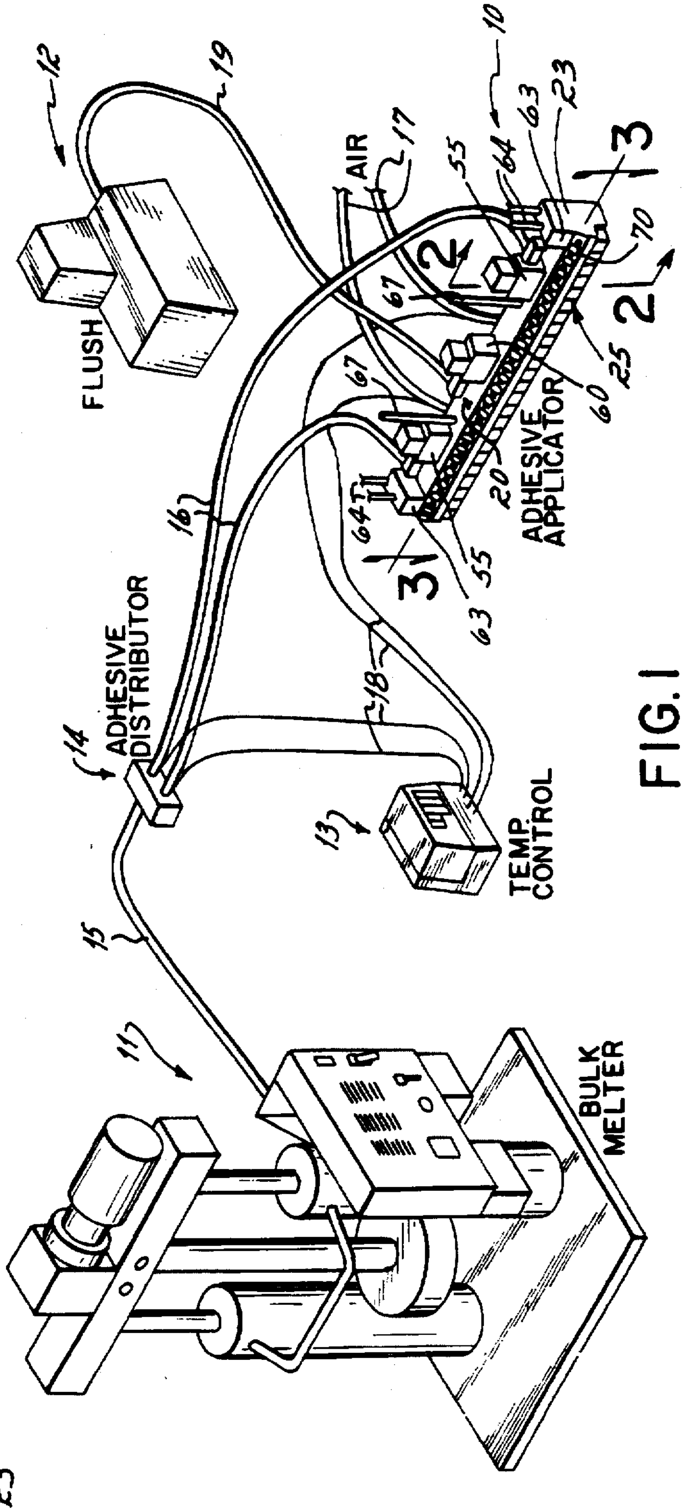
FIG. 1 is a diagrammatic illustration of a PUR hot melt adhesive application system employing the adhesive applicator of the present invention.

FIG. 1 shows the adhesive applicator 10 of the present invention connected to a system comprising an adhesive bulk melter 11, a polyurethane resin (PUR) flush system 12, a temperature controller 13 and an adhesive distributor 14. The bulk melter 11 melts solid granules of a polymeric adhesive such as PUR and pumps the molten adhesive to the adhesive distributor 14 through a hose 15. Heated hoses 16 carry the adhesive from the adhesive distributor 14 to the inlets of two adhesive supply valves 55 mounted on the adhesive applicator 10. A pair of heated air hoses 17 are attached to a source of compressed air (not shown) and are connected to the air inlet ports 41 of the adhesive applicator 10. The adhesive and air hoses 16, 17 are connected to wire leads 18 extending from the temperature controller 13. The wire leads 18 supply electricity for activating the resistance-type heaters which are formed as part of the hoses 16, 17. As is well known in the art, the temperature controller 13 precisely regulates the temperature of all components carrying either air or adhesive to maintain the adhesive in a molten state.

As previously mentioned, the adhesive applicator 10 of the present invention is particularly suitable for use with PUR hot melts. For this reason, another hose 19 is connected between the flush system 12 and a cleaning fluid control valve 60 mounted on the adhesive applicator 10 such that cleaning fluid may be pumped from the flush system 12 through the adhesive manifold 20. Both the adhesive and the cleaning fluid are directed under pressure through the adhesive manifold 20 by way of a series of passageways leading from the respective valves 55, 60, through a series of needle valves 70, and finally through a corresponding series of nozzle adapter or mounting blocks 25 which include a nozzle assembly comprising, as one example, a cap 28 and a nozzle insert 29. Although the nozzle assemblies 28, 29 are depicted in FIG. 1 as being exactly aligned along the length of the applicator 1 0, they may alternatively be staggered relative to one another along the length of the applicator 10 depending on the application requirements.

Figures 2, 2A:
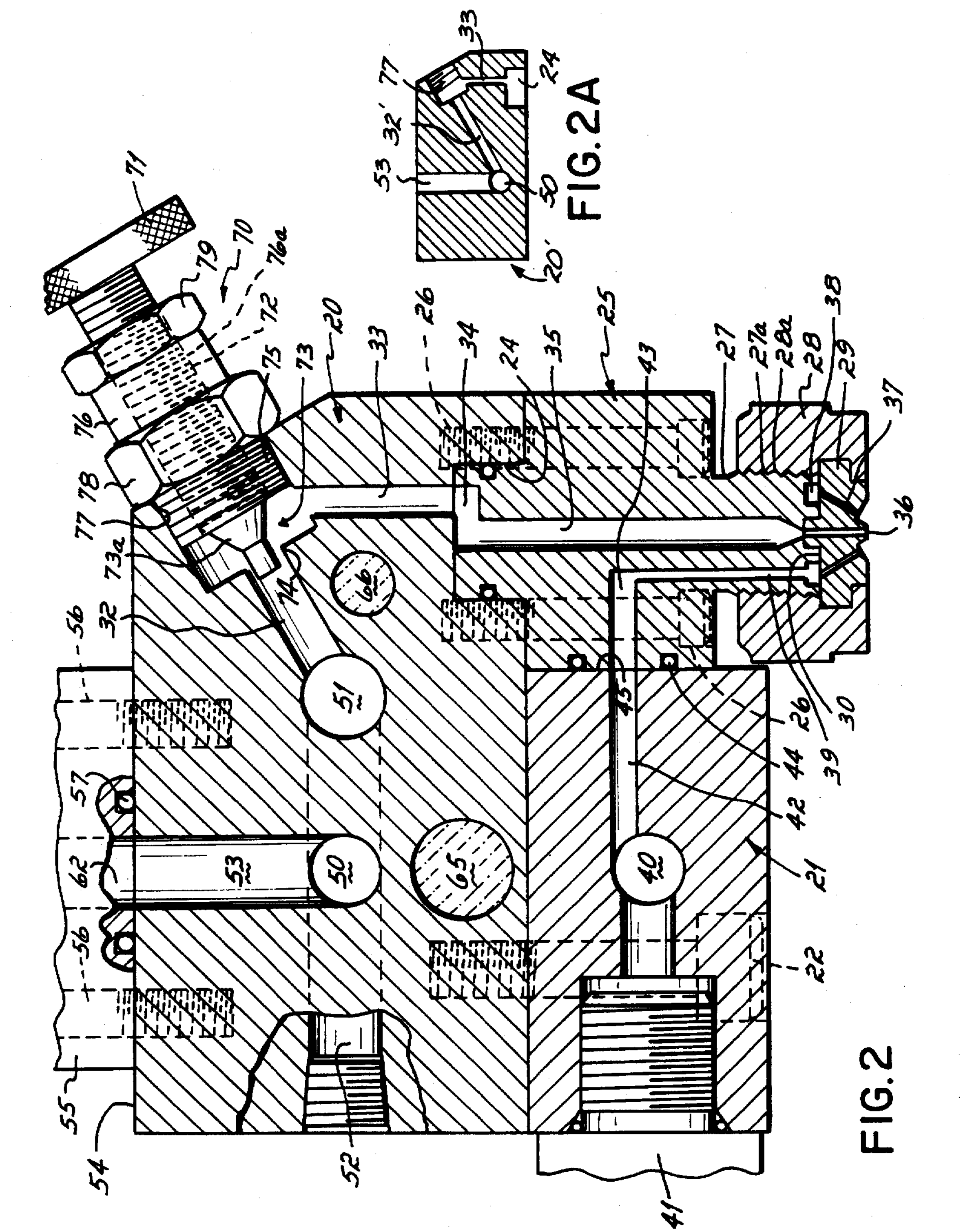
FIG. 2 is a cross sectional view of the adhesive applicator taken along line 2—2 of FIG. 1 and showing the adhesive and air flow paths to a nozzle.
FIG. 2A is a cross sectional view of a second embodiment of the adhesive manifold of the applicator showing an alternative adhesive flow path therein; and, FIG. 3 is a cross sectional view of the adhesive applicator taken along line 3—3 of FIG. 1 and showing the passageways in the adhesive manifold and air manifold of the applicator.

Turning now to FIG. 2, the adhesive applicator 10 comprises an adhesive manifold 20 and an air manifold 21. The air manifold 21 is shown mounted to the adhesive manifold 20 by screws 22 although the adhesive manifold 20 and air manifold 21 may also be formed as one integral unit. The adhesive manifold 20 includes a series of nozzle adapter or mounting blocks 25 each including a nozzle assembly 28, 29 as mentioned above and each being removably attached to the adhesive manifold 20 by screws 26. Each nozzle adapter or mounting block 25 includes a threaded extension 27 having external threads **27*aa* which mate with internal threads 28*aa* of the cap 28. As previously mentioned, the cap 28 holds a nozzle insert 29 against an end surface 30 of the threaded extension 27**.

The nozzle insert 29 includes a central adhesive discharge passageway 36 surrounded by a plurality of angled air ports 37. The angled air ports 37 are connected to a source of pressurized air by way of the air manifold 21. The air ports 37 impart a swirling or twisting action to the bead of adhesive being discharged through the central adhesive discharge passageway 36 of the nozzle insert 29. Other conventional types of nozzles may also be attached to the adhesive manifold 20 by screws 26. For example, nozzles which discharge a single, straight bead of adhesive or a fan spray pattern of adhesive may be used in place of or in conjunction with the nozzle assemblies 28, 29 which produce a swirl pattern of adhesive. If swirl nozzle assemblies 28, 29 are used as shown, then adjacent nozzle assemblies 28, 29 will preferably be designed such that the adhesive being discharged from adjacent discharge passageways 36 swirls in opposite directions. This design is shown in commonly assigned U.S. Pat. No. 4,815,660 to Boger and, therefore, need not be explained further in detail. U.S. Pat. No. 4,815,660 to Boger is expressly incorporated by reference herein.

The end surface 30 of the threaded extension 27 includes an annular air chamber 38 which communicates with an air passageway 39 in the nozzle adapter or mounting block 25. The annular chamber 38 allows air to be distributed to each angled air port 37 in the nozzle insert 29. Pressurized air reaches each nozzle adapter or mounting block by way of a central air passageway 40 in the air manifold 21 which is fed pressurized air through an air inlet 41 in the air manifold 21. A series of transverse air passageways 42 lead from the central air passageway 40 to an outer surface 45 of the air manifold 21 so that, when both the air manifold 21 and nozzle adapters or mounting blocks 25 are secured to the adhesive manifold 20, the transverse air passageways 42 in the air manifold 21 will line up with the respective air passageway 43 in each of the nozzle adapters or mounting blocks 25. Each of the these air passageways 43 in turn communicates with the air discharge passageway 39 in each of the nozzle adapters or mounting blocks 25. An O-ring seal 44 is provided between the outer surface 45 of the air manifold 21 and each of the nozzle adapters or mounting blocks 25 about the respective air passageways 42, 43 to maintain a fluid tight connection between air passageways 42, 43.

Figure 3:
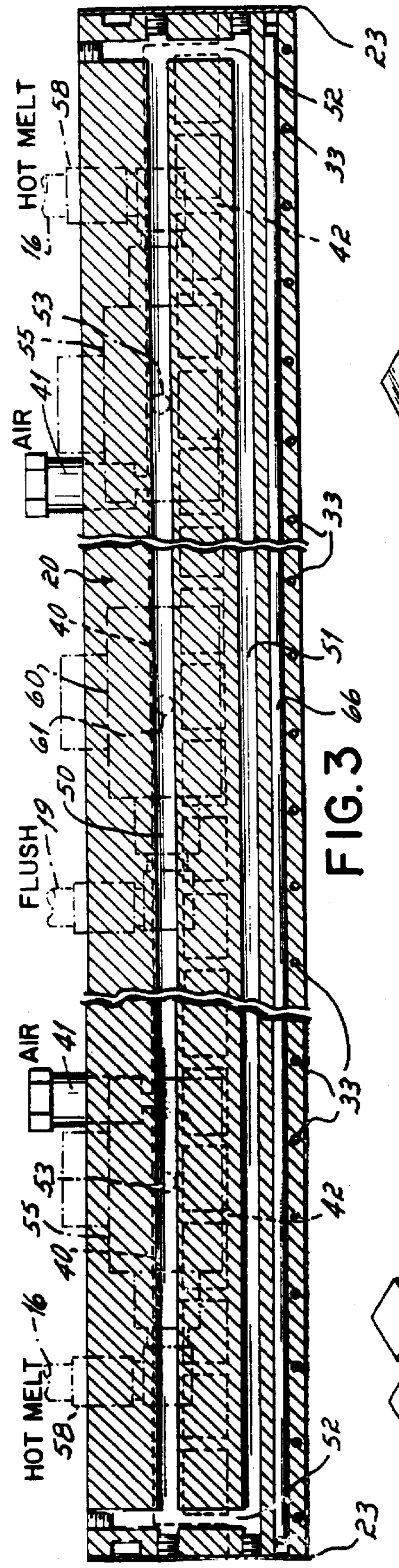

Referring specifically now to FIG. 3, the adhesive manifold 20 includes a longitudinally extending central adhesive passageway 50 and another longitudinally extending adhesive passageway 51 which provides the adhesive for each of the nozzle adapters or mounting blocks 25 via a series of passageways 32, 33 and needle valves 70 to be described below with reference to FIG. 2. Connecting passageways 52 at each end of the adhesive manifold 20 connect the central adhesive passageway 50 to the adhesive passageway 51. An adhesive input port 53 leads from an outer surface 54 of the adhesive manifold 20 to the central adhesive passageway 50. The adhesive input port 53 communicates with the output port 62 of adhesive supply valve 55. The adhesive supply valves 55 are mounted to the outer surface 54 of the adhesive manifold 20 by screws 56. The adhesive supply valves 55 may, for example, be model H200 modules manufactured and sold by the assignee of the present invention, Nordson Corporation of Westlake, Ohio A seal 57, which may be an O-ring seal, is located between the supply valve 55 and the outer surface 54 of the adhesive manifold 20 to provide a fluid tight connection between ports 53, 62.

Turning briefly to FIG. 2A, an alternative adhesive manifold 20' is shown and differs from the adhesive manifold 20 shown in FIGS. 2 and 3 only in that the second longitudinal adhesive flow path 51 as well as the connecting passageways 52 of the first embodiment have been eliminated and passageways 32 of the first embodiment have been modified into passageways 32'. Passageways 32' extend from each threaded hole 77 which receives a needle valve 70 (not shown) to the central longitudinal adhesive passageway 50. This modified adhesive manifold 20' thus essentially eliminates the adhesive flow loop created by passageways 50, 51 and 52 of the first embodiment. Instead, the adhesive travels from the adhesive input port(s) 53 into the central passageway 50, the series of passageways 32', through needle valves 70 (not shown) connected to threaded holes 77, into passageways 33 and nozzle adapters 25 (not shown) mounted in recesses 24. The remaining structure, components and operation of an adhesive applicator utilizing the modified adhesive manifold 20' are identical to the applicator 10 of the first embodiment.

Although the adhesive applicator 10 shown in the preferred embodiment includes two adhesive supply valves 55, it will be appreciated that the number of adhesive supply valves 55 which are necessary depends, among other parameters, on the number of nozzles and the desired performance characteristics of the applicator 10. The adhesive applicator 10 shown and described herein includes twenty-four nozzle assemblies 28, 29 and two supply valves 55 for applying adhesive along a path 24" in width. Depending on the particular application, molten adhesive is supplied to the adhesive manifold 20 preferably at between 700-1200 psi. It will be appreciated that if the applicator 10 is downsized by 50%, i.e., if only twelve nozzle assemblies 28, 29 are used to apply adhesive in a 12" wide path, then only one adhesive supply valve 55 is necessary. It will further be appreciated that the present invention provides a "modular " applicator not only because the nozzle adapters or mounting blocks 25 and their respective nozzle assemblies 28, 29 may be quickly retrofitted with different nozzles but because a plurality of applicators 10 of the same or different lengths may be mounted end to end to form various lengths and thereby apply adhesive along paths of various widths depending on the specific application requirements.

As further shown in FIG. 3, the adhesive applicator 10 further includes a cleaning fluid supply valve 60, which may also be a model H200 module manufactured and sold by Nordson Corporation of Westlake, Ohio and which is also mounted to the outer surface 54 of the adhesive manifold 20 in a manner identical to the adhesive supply valves 55. The cleaning fluid supply valve 60 communicates with the central adhesive passageway 50 of the adhesive manifold 20 by way of an input port 61. The input port 61 is identical to the input ports 53 which communicate between the adhesive supply valves 55 and the central adhesive passageway 50. Therefore, although not shown in the drawings, a seal identical to seal 57 will be provided between the output port (not shown) of the cleaning fluid supply valve 60 and the cleaning fluid input port 61 of the adhesive manifold 20. The cleaning fluid supply valve 60 allows cleaning fluid from the flush system 12 to enter the adhesive ports 50, 51, 52 and discharge through the nozzle adapters or mounting blocks 25 as well as the nozzle assemblies 28, 29 via passageways 32–36 and needle valves 70 in order to flush the adhesive manifold 20, nozzle adapters or mounting blocks 25 and nozzle inserts 29 of PUR or other adhesive as described further below.

The adhesive applicator 10 also includes a pair of junction boxes 63 having cord sets 64 which receive electric cables (not shown) to supply power to a heater 65 and a resistance temperature detector (RTD) 66. The heater 65 maintains the molten adhesive within the adhesive manifold 20 and the air in the air manifold 21 at an elevated temperature which is preferably in the range of 350° –400° F. As is well known in the art, the specific temperature is selected according to the adhesive material used and the heater 65 is controlled by the RTD 66 as is also well known in the art.

Turning now to FIG. 2, a needle valve 70 is provided in the adhesive manifold 20 for individually regulating adhesive flow to each nozzle adapter or mounting block 25 and the respective nozzle assemblies 28, 29. All of the needle valves 70 are identical and therefore only one is described herein in detail. The needle valves 70 regulate the flow of adhesive between the adhesive passageways 32 and 33 upstream of each nozzle adapter or mounting block 25. In this regard, each needle valve 70 is attached to the adhesive manifold 20 at the junction of respective passages 32 and 33 in the adhesive manifold 20. The needle valves 70 each include a rotatable handle 71 rigidly connected to an externally threaded valve stem 72 which is received by an threaded central passage 76*a* in the valve body 76 and terminates at an end 73 having a frusto-conical outer surface 73*a*. The terminal end 73 is adjustable relative to a seat 74 which is defined by the outer end of passage 32.

The valve body 76 also includes an externally threaded portion 75 by which the needle valve 70 is threaded into an internally threaded hole 77 in the adhesive manifold between passages 32 and 33.

A nut 78 is provided as part of the valve body 76 for allowing a wrench to be used for threading each needle valve 70 into a respective hole 77 in the adhesive manifold 20. The outer, threaded portion of the valve stem 72 receives a lock nut 79 for allowing the position of the terminal end 73 of the valve stem 72 to be fixed at a desired position relative to the seat 74. As shown in FIG. 2, the terminal end 73 is shown in substantially a fully open position which allows molten adhesive to flow from passage 32 to passage 33 and through the nozzle insert 29 at a relatively high flow rate. Of course, the design and/or shape of the terminal end 73 and the valve seat 74 as well as other aspects of the needle valve 70 may be readily changed to suit the flow adjustment requirements of particular applications.

The needle valves 70 allow the amount of adhesive being discharged from each nozzle insert 29 to be individually or separately adjusted to adjust the amount of adhesive being dispensed along the length of the adhesive applicator 10. Thus, by measuring the amount of adhesive being discharged from each nozzle insert 29, and adjusting the adhesive flow using the needle valves 70, the discharge of adhesive may be equalized or balanced along the length of the adhesive applicator 10. Alternatively, for certain applications the needle valves 70 may be used to allow heavier application of adhesive along a segment or segments of the adhesive applicator 10 and a lighter application of adhesive along the remaining segments or segments of the adhesive applicator 10.

Operation

During start-up procedures, if a balanced or equal amount of adhesive is to be applied across the width of a substrate, the amount of adhesive being discharged from each of the nozzle assemblies 28, 29 is equalized by adjusting the needle valves 70. In this regard, the amount of adhesive flowing from each of the nozzle assemblies 28, 29 per unit time is weighed or measured to correspond to a predetermined amount for the particular application. For certain other applications, it may be necessary to adjust the needle valves 70 such that a heavier application of adhesive is applied in a central portion of the substrate and a lighter application of adhesive is applied along the outside edge portions of the substrate. For these applications, the central needle valves 70 are adjusted until a predetermined, relatively heavy amount of adhesive is being discharged from their corresponding nozzle assemblies 28, 29 and the outer needle valves 70 proximate the ends of the adhesive applicator 10 are adjusted until a predetermined, relatively light application of adhesive is being discharged from the corresponding outer nozzle assemblies 28, 29. Of course, other variations in the amount of adhesive dispensed across the applicator 10 are also possible.

Once the amount of adhesive discharged from the adhesive applicator 10 has been determined and properly set, and the adhesive applicator 10 is mounted a proper distance from a substrate by way of mounting rods 67. Adhesive is then pumped through the hoses 15, 16 and pressurized air is directed through the air hoses 17 into the respective adhesive and air manifolds 20, 21. The substrate is moved relative to the applicator 10 in a direction perpendicular to the length of the applicator 10 as the molten adhesive is discharged from the nozzle assemblies 28, 29.

Turning now to FIGS. 2 and 3, the adhesive will enter the respective inlets 58 of the supply valves 55 and into the respective input ports 53 in the adhesive manifold 20. The molten adhesive will then fill the central adhesive passageway 50, the connecting ports 52, and the longitudinally extending passageway 51 which communicates with each of the needle valves 70 through passageways 32. Each needle valve 70 allows the molten adhesive to flow from passageway 32 to passageway 33 under a flow rate which was determined during the start-up procedures discussed above. The predetermined rate of adhesive flow is then directed through passageways 34, 35 in the nozzle 25 and finally through the central discharge passageway 36 of the nozzle insert 29. At the same time, pressurized air enters the air manifold 21 through air inlets 41, central air passageway 40, transverse air passageways 42 and air passageways 43 in each of the nozzle adapters or mounting blocks 25. The pressurized air travels through air passageways 39, 43 in each nozzle adapters or mounting blocks 25 into the annular chamber 38 thereof and, finally, through the angled air passageways 37 in the nozzle insert 29. As previously mentioned, the air exiting the angled air passageways 37 imparts a swirling or twisting motion to the adhesive bead being discharged from the central adhesive discharge 36 of the nozzle insert 29.

When it is desired to flush or clean the adhesive applicator 10 of hot melt adhesive such as PUR, the flow of adhesive and air through the adhesive hoses 16 and the air hoses 17 is stopped and the adhesive supply valves 55 are closed. With the needle valves 70 preferably in a fully opened position, cleaning fluid is then pumped from the flush system 12 through the hose 19 into the cleaning fluid supply valve 60 which is opened to allow cleaning fluid to travel through the adhesive passageways in the adhesive manifold 20 and through the opened needle valves 70, the nozzle adapters or mounting blocks 25 and the nozzle insert 29. Cleaning fluid is directed through the adhesive manifold 20 and nozzle inserts 29 until the fluid draining from nozzles 25 is substantially free of PUR or other hot melt adhesive.

While the invention has been described with reference to a preferred embodiment, it will be understood by those skilled in the art that various changes may be made and equivalents may be substituted for elements thereof without departing from the scope of the invention. In addition, many modifications may be made to adapt a particular application or material to the teachings of the invention without departing from the essential scope thereof. Therefore, it is intended that the invention not be limited to the particular embodiment disclosed as the best mode contemplated for carrying out this invention, but that the invention will include all modifications falling within the scope of the appended claims.

I claim:

1. Apparatus for dispensing hot melt adhesive comprising:

an adhesive manifold including an adhesive input port for supplying adhesive to a series of adhesive passageways in said adhesive manifold;

a plurality of nozzles attached to said adhesive manifold, each nozzle including an adhesive passageway communicating with the adhesive passageways of said adhesive manifold;

a plurality of valve seats formed as part of said manifold and disposed between respective adhesive passageways in said manifold and said nozzles; and, a plurality of needle valves extending into said adhesive manifold, each needle valve including a valve stem extending into said adhesive manifold and including a portion thereof which is adjustable relative to one of said valve seats formed as part of the adhesive passageways of said adhesive manifold for controlling the flow of adhesive to a nozzle.

2. The apparatus of claim 1 wherein said adhesive manifold includes passageways which form an adhesive circulation loop within said adhesive manifold.

3. The apparatus of claim 1 wherein said plurality of nozzles are removable attached to said adhesive manifold.

4. The apparatus of claim 1 further comprising a control valve connected to said adhesive input port of said adhesive manifold for controlling the supply of adhesive to said adhesive passageways in said adhesive manifold.

5. The apparatus of claim 1 wherein said apparatus further includes an air manifold operatively connected to said adhesive manifold, said air manifold including an air inlet connected to a series of air passageways within said air manifold, said air passageways in said air manifold being connected to air passageways in said adhesive manifold and said plurality of nozzles.

6. The apparatus of claim 5 wherein said air passageways in said nozzles are disposed in a pattern which causes said adhesive to be discharged in a swirling pattern when pressurized air is directed therethrough.

7. The apparatus of claim 1 wherein said adhesive manifold further includes a cleaning fluid input port for supplying cleaning fluid to the series of adhesive passageways in said adhesive manifold and nozzles.

8. The apparatus of claim 7 further comprising a second control valve connected to said cleaning fluid input port of said adhesive manifold for controlling the supply of cleaning fluid to said adhesive supply passageways in said adhesive manifold.

9. A method of continuously applying a coating of hot melt adhesive on a substrate with an adhesive dispensing applicator including an adhesive control valve connected to a manifold having a plurality of adhesive passageways connected to a plurality of generally aligned dispensing nozzles by way of a plurality of needle valves which respectively control the flow of adhesive to said plurality of dispensing nozzles, each needle valve including a valve stem extending into said manifold and including a portion thereof which is adjustable relative to a valve seat located in the adhesive passageways of said manifold and formed as part of said manifold for controlling the flow of adhesive to a nozzle, the method comprising the steps of:

opening said control valve to allow molten adhesive to flow into said fluid paths, adjusting said needle valves to establish a predetermined flow rate of adhesive through each respective nozzle and a resulting predetermined adhesive coating pattern on said substrate, and moving said substrate and said dispensing applicator with respect to each other while said control valve is opened so as to coat said substrate with adhesive discharged from said nozzles.

10. The method of claim 9 wherein said manifold further includes a cleaning fluid inlet port connected to said adhesive passageways and the method further comprises the steps of:

closing said control valve to stop the flow of molten adhesive through said adhesive passageways and said nozzles after said substrate has been coated, and introducing cleaning fluid into said cleaning fluid inlet port to flush residual adhesive from said adhesive passageways and said nozzles.

11. The method of claim 10 further comprising the step of fully opening each needle valve before introducing said cleaning fluid into said cleaning fluid inlet port.

12. Apparatus for dispensing hot melt adhesive comprising:

an adhesive manifold including an adhesive input port for supplying adhesive to a series of adhesive passageways in said adhesive manifold;

a plurality of nozzles attached to said adhesive manifold, each nozzle including an adhesive passageway communicating with the adhesive passageways of said adhesive manifold; and, a plurality of needle valves connected to said adhesive manifold and including valve stems which are adjustable relative to valve seats located in said adhesive passageways of said adhesive manifold, said valve stems being operatively connected to respective manually operable handles for allowing adjustment in the flow rate of adhesive within said passageways of said adhesive manifold.

* * * * *